(12) United States Patent
Ackermann

(10) Patent No.: US 6,387,177 B1
(45) Date of Patent: May 14, 2002

(54) METHOD FOR MANUFACTURING A SEGMENTED CRYSTAL

(75) Inventor: Lothar Ackermann, Idar-Oberstein (DE)

(73) Assignee: Forschunginstitut fur mineralische und metallische Werkstoffe Edelsteine/Edelmetalle GmbH, Idar-Oberstein (DE)

( * ) Notice: Subject to any disclaimer, the term of this patent is extended or adjusted under 35 U.S.C. 154(b) by 0 days.

(21) Appl. No.: 09/628,901

(22) Filed: Jul. 31, 2000

(30) Foreign Application Priority Data

Aug. 4, 1999 (DE) .......................... 199 36 651

(51) Int. Cl.⁷ .................. C30B 15/00; C30B 21/06; C30B 27/02; C30B 28/10; C30B 30/04
(52) U.S. Cl. .................. 117/13; 117/1; 117/2; 117/12; 117/34
(58) Field of Search .................. 117/1, 2, 12, 13, 117/36

(56) References Cited

U.S. PATENT DOCUMENTS

| | | | |
|---|---|---|---|
| 2,753,280 A | 7/1956 | Moore | 148/1.5 |
| 2,768,914 A | 10/1956 | Buehler et al. | 148/1.6 |
| 3,070,465 A | 12/1962 | Tsukamoto | 148/1.5 |
| 3,192,082 A | 6/1965 | Tomono et al. | 148/172 |
| 5,285,467 A | * 2/1994 | Scheps | 372/69 |
| 5,394,420 A | 2/1995 | Senn et al. | 372/39 |
| 5,852,622 A | * 12/1998 | Meissner et al. | 372/39 |

FOREIGN PATENT DOCUMENTS

EP 0 864 671 9/1998

OTHER PUBLICATIONS

K. Shimamura, et al. "A new crystal growth method for in situ core doping", Journal of Crystal Growth, 142, Nos. 3/4, pp 400–402, 1994.
V. Nikolov, et al. "Effect of the hydrodynamics in high–temperature solutions on the quality of pure and substituted YIG single crystals grown by the TSSG method", Journal of Crystal Growth, 75, pp 269–276, 1986.

* cited by examiner

Primary Examiner—Felisa Hiteshew
(74) Attorney, Agent, or Firm—Michael L. Dunn

(57) ABSTRACT

The present invention relates to a method for manufacturing a crystal with at least two segments, wherein adjacent segments differ by at least one characteristic. The different segments can, for example, be of different materials, or have a different doping agent. The method makes possible the manufacturing of segmented crystals with high crystal quality, and as planar joining surfaces between the individual segments as possible. This is achieved in that the segmented crystal is grown directly from the molten mass.

23 Claims, 1 Drawing Sheet

METHOD FOR MANUFACTURING A SEGMENTED CRYSTAL

BACKGROUND OF THE INVENTION

The present invention relates to a method for manufacturing a crystal with at least two segments, wherein adjacent segments differ by at least one characteristic. The different segments can, for example, be of different materials, or have different doping (different concentration or different doping agent).

In particular in laser technology, optical components that are composed of different crystal segments offer considerable advantages in use. Different designs of compound segmented laser crystals are already known in laser diode pumped and lamp pumped solid state lasers. Thus, for example, multiple wavelength lasers (for example Nd:YAG-Er:YAG for wavelengths of λ=1064 nm and 2940 nm) can be produced with segmented laser crystals. The known segmented laser rods have different doping concentrations over the length of the rod.

The segmented crystals on the market are manufactured with the aid of two different methods.

Thus, for example, the Verneuil crystal growing process is used for manufacturing ruby laser rods with undoped ends. In this case, the flame of an oxy-hydrogen burner is directed perpendicularly downwards onto a rotating seed crystal. A flow of oxygen "entrains" the pulverized starting material. This is melted in the flame and results in crystal growth at the upper end of the crystal.

The advantage of the Verneuil process, which is also called the flame-melting process, is the lack of a crucible. The large temperature differences, which generally result in stresses and non-homogeneity in the crystal, are, however, disadvantageous. In addition, a curved joint line between different segments is always obtained with this process.

The other process known in the technology for manufacturing segmented laser rods uses the "bonding" technique. Here, crystals are assembled by thermal means, by ion diffusion. The crystals segments to be joined are separately grown for this purpose, and have to be polished to a planarity of at least 1/10 of the laser wavelength. The polished surfaces must subsequently be assembled in a crystalographically orientated manner. This process is very time consuming and can only be carried out under clean room conditions. As a result, it is also very expensive.

The object of the present invention is therefore to provide a method for manufacturing a crystal with at least two segments, which makes possible the manufacturing of segmented crystals with a high crystal quality, and as planar as possible joining surfaces between the individual segments, and which is very cost effective.

This object is solved in that the segmented crystal is grown directly from the molten mass.

This is possible using both the Czochralski method and the flux method.

In the Czochralski method, a crystal is drawn unsupported from a molten mass present in a crucible, with precise control of the drawing speed. This method of crystal growing is generally initiated using a thin seed crystal with the desired orientation. This method has the advantage that the finished crystal is no longer in contact with the crucible.

In order to manufacture a segmented crystal, a crystal with a specific composition is drawn from the molten mass, for example, with the additional assistance of an orientated seed crystal. The drawing process is then interrupted, that is to say the drawing speed at which the crystal is being drawn from the molten mass is substantially zero, and the composition of the molten mass is altered. The drawing process is then resumed and a further segment, with a different composition, grows on the crystal.

Particularly preferred is a method with these steps:

immersion of a crystal with a specific composition into a molten mass with a different composition, crystallising on, further drawing of a crystal segment with the different composition.

The procedure wherein the crystal is placed in the molten mass is known as crystallising on. Because, before being placed in, the crystal has a temperature well below the melting temperature, heat is dissipated via the crystal from the contact surfaces between the crystal and the molten mass, and a few grams of the molten mass spontaneously crystallise on the crystal.

It is thus of importance that after the crystal with a specific composition has been drawn, it is removed from the molten mass, and, in a further step, is then immersed in a molten mass with a different composition.

With the aid of this method, large, segmented single crystals can very easily be manufactured. With crystal growth according to this method, however, under normal growing conditions, a curved, conical growth front forms, caused by the thermal gradients and the expansion coefficients of the molten mass. This growth front follows the molten mass isotherms. This molten mass isotherm generally occurs because of molten mass convection going from the edge of the crucible to the centre of the crucible.

In most cases, however, segmented crystals, in particular segmented laser crystals, with substantially planar boundary faces are desired.

BRIEF DESCRIPTION OF THE INVENTION

A particularly advantageous method for manufacturing a segmented crystal therefore provides that the crystal rotates about its own axis during crystal growth. By means of rotation of the crystal, the downward convection below the crystal is weakened, so the molten mass isotherm follows a more planar course.

A method is therefore particularly preferred in which the crystal rotates at the inversion rotation speed during the crystal rotation. The inversion rotation speed, which is dependent inter alia upon the diameter of the crystal, is the speed of rotation at which molten mass isotherm runs horizontally, so a horizontal growth front is also constructed.

DETAILED DESCRIPTION OF THE INVENTION

Figure 1A:
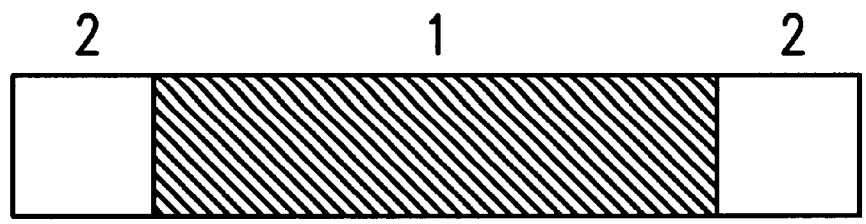
FIG. 1 shows a laser crystal with undoped ends.
FIG. 1b shows a laser crystal with accreted passive Q-switch crystal.
FIG. 1c shows a laser crystal composed of segments with different doping concentrations.
FIG. 1d shows a laser crystal composed of segments 8 and 9 with different doping agents.

By rotation of the crystal during crystal growth, a growth front curved substantially as desired, or a planar growth front, can be selected.

It is also possible to affect an already existing curved or planar growth front by altering the speed of rotation. It is thus possible, for example, to immerse a doped or undoped crystal with a curved, conical growth front into a molten mass with a different composition, and then, by slowly increasing the speed of rotation up to the inversion speed, to produce melting of the cone in order to obtain a planar end surface. Thereafter, it is then possible to continue crystallisation by initiating the drawing process, that is to say the slow drawing out of the crystal from the molten mass.

By immersing a crystal with a relatively large diameter (>30 mm) into a molten mass of typically 2000° C., the crystal suffers a temperature shock and forms cracks, which can destroy the entire crystal. If the crystal to be immersed is conically configured on the underside, the contact surface, when it is placed in the molten mass, is only a few mm in diameter, so the crystal suffers no damage. The further immersion of the entire conical lower part into the hot molten mass causes no damage to the crystal. If the entire conical part of the crystal is completely immersed in the molten mass, this cone is melted by means of the subsequent increase in rotation, up to the critical "inversion rotation", and thereby a planar crystal front is obtained.

The crystallising on, described above, often produces defects such as, for example, bubbles, on the boundary surface of the crystal. Unexpectedly, an improvement in the crystal quality is also possible here, when at least a part of the material crystallised on is, as a result, melted again.

Particularly high crystal quality can consequently be obtained by means of the following method steps:
drawing of a crystal with a specific composition, possibly using a crystallographically orientated seed crystal, with low speed crystal rotation, to the desired crystal length,
removal of the crystal from the molten mass,
immersion of the crystal with a necessarily conical end into a molten mass with a different composition,
crystallising on,
continuous increase in the crystal rotation speed up to the inversion speed, whereby the cone is melted away,
further drawing of the crystal.

In the instance wherein the segmented crystal must have more than two segments, it can be advantageous when the speed of rotation is reduced again before the target length of the segment concerned is reached, so the crystal end again gets a conical end. This is then immersed in a molten mass with a different composition, and by stepwise increase of the crystal rotation speed, is then melted away again before the growth of the next segment occurs.

Naturally, it is also possible, however, to immerse an undoped or doped crystal with planar phase boundary surfaces in a molten mass with a different composition, and after crystallising on, to further grow the crystal with a cured or planar growth front. In many crystals there is then nevertheless the risk of formation of cracks on the boundary surface.

A special embodiment of this method provides that firstly, an undoped crystal or a crystal with a low doping with a planar growth front is drawn to the target length, the drawing process is then interrupted, and the molten mass is then doped or more highly doped while the crystal remains immersed in the molten mass. The drawing process is then continued, so a crystal segment with a doped or more highly doped composition forms. In this way even crystals that show a continuous transition of concentration over at least part of the crystal length can be manufactured. This is particularly advantageous when the lattice constants change because of doping. Because of the continuous transition from one segment with one doping concentration to another segment with another doping concentration, the occurrence of crystal defects (for example, dislocations, grain boundaries) is prevented.

In the flux method, however, a molten mass is used which does not correspond to the composition of the crystal to be drawn. The individual components of the crystal are instead dissolved in this molten mass (flux). This method has the advantage that certain crystals can be grown significantly below the melting temperature of the crystal to be grown. In this case, as with the Czochralski process, in general an orientated seed crystal is firstly placed in the molten mass. Crystal growth is caused by a gradual reduction of the temperature of the molten mass. The crystal grows in the molten mass and is in general pulled out of the molten mass only after completion of the growth. There are, however, also flux methods, for example the "top seeded" method, in which the crystal is slowly pulled out of the molten mass during growth, so a relatively large crystal can be pulled from a relatively small crucible volume.

The method described offers the possibility of manufacturing segmented crystals very inexpensively, with large geometrical dimensions, and above all, of excellent quality. Smaller crystals of almost any geometry can be obtained from the large crystals by drilling out or sawing out.

Further advantages, features and possibilities for application of the method will be clear from the examples of application shown in the drawings.

As FIG. 1a shows, using the method described it is possible to manufacture laser crystals, the ends 2 of which are less strongly doped, or not doped at all. Thus, for example, laser rods 1 of doped YAG or $YVO_4$ can be manufactured with undoped ends. In this way autoabsorption of the unpumped ends 2 is prevented. Moreover, it is possible to vapour deposit the cavity mirror of the laser on the undoped ends 2 of the laser rods. Thermal deformation of the mirror surfaces is prevented by the undoped ends 2.

Figure 1B:
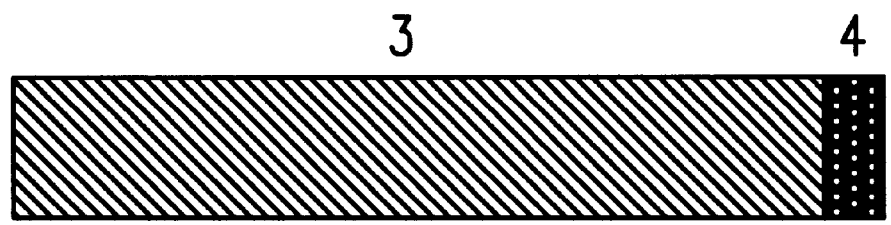

FIG. 1b shows a laser crystal 3 with an accreted passive Q switch crystal 4. This Q switch crystal 4 has a specific doping so that it acts as saturable absorber and can be used as a passive Q switch for modulating laser beams in the kHz range. Thus, a $Cr^{4+}$ doped YAG crystal can be used as a Q switch for the laser wavelengths of Nd:YAG(1064 nm).

Normally for this, $Cr^{4+}$:YAG wafers have to introduced into the beam path, and anti-reflection coated on both sides. Every boundary surface against the air produces undesirable losses. A segmented laser rod with an integrated Q switch 4 is therefore extremely advantageous.

Figure 1C:
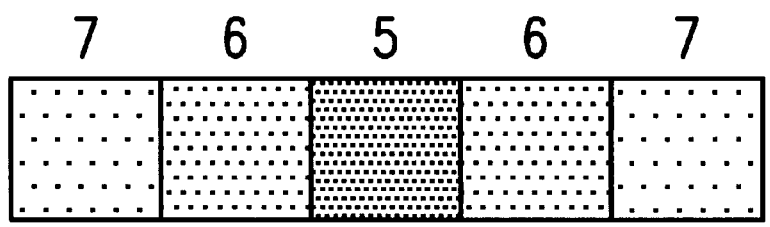

As can be seen in FIG. 1c, with the aid of this method, a segmented crystal can be manufactured which can have almost any number of segments (5, 6, 7) with different doping concentrations. A laser crystal with five segments is shown, wherein the doping concentration increases from the outside to the inside. In this way multiple wavelength lasers can be produced.

Figure 1D:
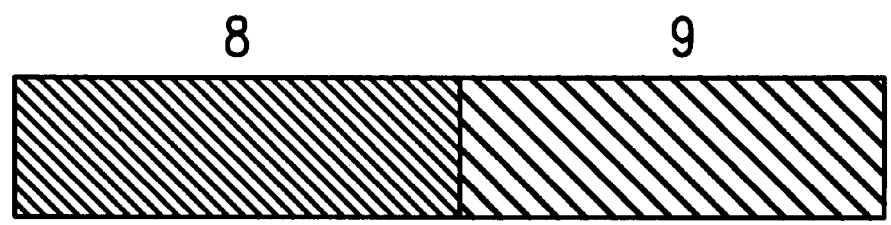

FIG. 1d shows a simple example of a crystal, composed of two segments 8 and 9 with different types of doping.

The method described functions, in principle, with all known laser crystals. It is, however, obviously not limited just to laser crystals.

What is claimed is:

1. A method for manufacturing a continuous single crystal having at least two integral segments which differ in composition, said method comprising the steps of:
   a) forming a first segment by drawing it from a first crystal forming molten mass having a first composition so that it has a longitudinal axis in the direction of drawing, b) providing a second crystal forming molten mass of a different composition, and c) drawing a second segment from the second molten mass integral with the first segment to form a continuous single segmented crystal wherein prior to drawing the second segment, the first segment is rotated about its longitudinal axis with an end in one of the molten masses, at a rotational inversion speed that forms a planar end surface within a plane essentially perpendicular to the longitudinal axis so that a planar boundary is formed at an interface between the first and second segments that is essentially perpendicular to said longitudinal axis.

2. The method of claim 1 wherein the first segment is initially formed with a non-planar end surface and is subsequently rotated with the end surface in one of the molten masses at the inversion speed to form a planar end surface.

3. A method according to claim 2, wherein the crystal is a laser crystal.

4. A method according to claim 2, wherein the crystal is a single crystal.

5. A method according to claim 2, wherein during drawing of the second crystal segment, the crystal rotates.

6. A method according to claim 2, wherein a segmented crystal with a desired shape is manufactured by being physically shaped from the segmented crystal.

7. The method of claim 1 further comprising the steps of:

a) providing a third crystal forming mass having a composition different than the second molten mass, and b) drawing a third segment from the third molten mass, which third segment is integral with the second segment wherein prior to drawing the third segment, the second segment is rotated about the longitudinal axis with the end of the second segment in one of the molten masses, at a rotational inversion speed that forms a planar end surface on the end of the second segment within a plane essentially perpendicular to the longitudinal axis, to form a planar boundary at an interface between the second and third segments that is essentially perpendicular to said longitudinal axis.

8. A method according to claim 7, wherein the crystal is a laser crystal.

9. A method according to claim 7, wherein the crystal is a single crystal.

10. A method according to claim 7, wherein during drawing of the second crystal segment, the crystal rotates.

11. A method according to claim 1, wherein the crystal is drawn from the molten mass using the Czochralski method.

12. A method according to claim 11, wherein the crystal is a single crystal.

13. A method according to claim 1, wherein the crystal is grown from the molten mass using the flux method.

14. A method according to claim 1, wherein the crystal is a laser crystal.

15. A method according to claim 1, wherein the crystal is a single crystal.

16. A method according to claim 1, wherein during drawing of the second segment, the crystal rotates.

17. A method according to claim 1, wherein a portion of the end surface is at least partially melted away while the crystal rotates.

18. A method according to claim 1, wherein a segmented crystal with a desired shape is manufactured by being physically shaped from the segmented crystal.

19. A single segmented crystal manufactured in accordance with the method of claim 1.

20. A continuous segmented single crystal comprising at least two integral segments having different compositions and a boundary at the interface of the segments wherein the boundary is planar, said boundary being essentially free of crystal defects.

21. The segmented single crystal of claim 20 wherein the planar boundary varies by less than 294 nm from a true plane.

22. The segmented single crystal of claim 20 wherein the crystal comprises at least three integral segments.

23. The segmented single crystal of claim 20 wherein the crystal has a diameter greater than 30 mm.

* * * * *